(12) United States Patent
Fukuda

(10) Patent No.: US 8,514,029 B2
(45) Date of Patent: *Aug. 20, 2013

(54) PIEZOELECTRIC VIBRATOR, OSCILLATOR, ELECTRONIC EQUIPMENT AND RADIO-CONTROLLED TIMEPIECE, AND METHOD OF MANUFACTURING PIEZOELECTRIC VIBRATOR

(75) Inventor: Junya Fukuda, Chiba (JP)

(73) Assignee: Seiko Instruments Inc. (JP)

( * ) Notice: Subject to any disclaimer, the term of this patent is extended or adjusted under 35 U.S.C. 154(b) by 233 days.

This patent is subject to a terminal disclaimer.

(21) Appl. No.: 13/035,468

(22) Filed: Feb. 25, 2011

(65) Prior Publication Data

US 2011/0148539 A1 Jun. 23, 2011

Related U.S. Application Data

(63) Continuation of application No. PCT/JP2008/065250, filed on Aug. 27, 2008.

(51) Int. Cl.
*H01L 41/053* (2006.01)
*H03B 5/32* (2006.01)

(52) U.S. Cl.
USPC ............ 331/156; 331/158; 310/370; 333/200

(58) Field of Classification Search
USPC .......................... 331/156; 333/200; 310/370
See application file for complete search history.

(56) References Cited

U.S. PATENT DOCUMENTS

| 2006/0066185 A1 | 3/2006 | Tanaya |
| 2008/0309202 A1* | 12/2008 | Dalla Piazza et al. ........ 310/348 |

FOREIGN PATENT DOCUMENTS

| JP | 05-191190 A | 7/1993 |
| JP | 07-335777 A | 12/1995 |
| JP | 2002-121037 A | 4/2002 |
| JP | 2003-142976 A | 5/2003 |
| JP | 2004-066225 A | 3/2004 |
| JP | 2006-094154 A | 4/2006 |
| JP | 2006-121544 A | 5/2006 |
| JP | 2007-081697 A | 3/2007 |
| JP | 2007-129327 A | 5/2007 |
| JP | 2007-184752 A | 7/2007 |
| JP | 2007-251238 A | 9/2007 |

OTHER PUBLICATIONS

International Search Report for International Application No. PCT/JP2008/065250, dated Nov. 18, 2008, 2 pages.

* cited by examiner

*Primary Examiner* — Joseph Chang
(74) *Attorney, Agent, or Firm* — Brinks Hofer Gilson & Lione

(57) ABSTRACT

A piezoelectric vibrator includes a base substrate and a lid substrate which are bonded to each other with a cavity formed therebetween; an external electrode that is formed on a lower surface of the base substrate; an internal electrode that is formed on an upper surface of the base substrate so as to be accommodated in the cavity; a through electrode which is formed so as to pass through the base substrate and electrically connect the external electrode with the internal electrode; a piezoelectric vibrating reed which is accommodated in the cavity in a state of being electrically connected to the internal electrode; and a getter material that is formed in the cavity, the getter material being formed of chromium or a metallic material consisting of chromium as a main ingredient.

5 Claims, 15 Drawing Sheets

| GETTER MATERIAL | BEFORE THE GETTERING (KΩ):A | AFTER THE GETTRING (KΩ):B | REDUCTION AMOUNT (KΩ):A-B |
|---|---|---|---|
| Al (1100Å) | 388 | 282 | 106 |
| Cr (600Å) | 401 | 237 | 164 |

FIG.17

PIEZOELECTRIC VIBRATOR, OSCILLATOR, ELECTRONIC EQUIPMENT AND RADIO-CONTROLLED TIMEPIECE, AND METHOD OF MANUFACTURING PIEZOELECTRIC VIBRATOR

RELATED APPLICATIONS

This application is a continuation of PCT/JP2008/065250 filed on Aug. 27, 2008. The entire contents of these applications are incorporated herein by reference

TECHNICAL FIELD

The present invention relates to a Surface Mount Device (SMD) type of piezoelectric vibrator in which a piezoelectric vibrating reed is accommodated in a cavity formed between two bonded substrates, an oscillator, electronic equipment and a radio-controlled timepiece having the piezoelectric vibrator, and a piezoelectric manufacturing method to manufacture the piezoelectric vibrator.

BACKGROUND ART

In recent years, piezoelectric vibrators using crystals or the like have been used in mobile phones or personal digital assistants, as a time source or a timing source such as a control signal, or a reference signal source and the like. Various types of piezoelectric vibrators are provided, but as one of them, an SMD type piezoelectric vibrator is known. As this type of piezoelectric vibrator, generally, a three layer structure type, in which a piezoelectric substrate formed with a piezoelectric vibrating reed are bonded so as to be interposed from above and below by a base substrate and a lid substrate, is known. In this case, the piezoelectric vibrating reed is accommodated in a cavity (sealing chamber) formed between the base substrate and the lid substrate.

Furthermore, recently, a two layer structure type is also developed instead of the three layer structure type. This type of piezoelectric vibrator has the two layer structure, in which the base substrate and the lid substrate are directly bonded to each other and the piezoelectric vibrating reed is accommodated within the cavity formed between both substrates. The piezoelectric vibrator of a two layer structure is excellent in that thinning can be promoted as compared to the three layer structure and is preferentially used.

However, it is generally desirable with piezoelectric vibrators that the equivalent resistance values (effective resistance value, Re) of the piezoelectric vibrator are further suppressed to a lower level. Since piezoelectric vibrators with lower equivalent resistance values can vibrate the piezoelectric vibrating reed using less voltage, they are more energy efficient piezoelectric vibrators.

As one of the common methods of suppressing the equivalent resistance value, a method of making a portion within a cavity closer to a vacuum is known. Furthermore, as a method of making the inner portion of the cavity closer to a vacuum, a method of accommodating (gettering) a getter material which is a metallic film in the cavity and irradiating a laser or the like from the outside to heat and activate the getter material is known (see Patent Citation 1).

According to this method, since the gas mainly consisted of oxygen in the cavity can be absorbed by the getter material entering the activation state by a chemical reaction, the inner portion of the cavity can be made closer to a vacuum. In addition, the getter material consists of aluminum, titanium, zirconium or an alloy thereof, but, particularly, aluminum is preferentially used in that it absorbs the gas in the cavity when being heated and can effectively improve a degree of vacuum (the gettering efficiency thereof is high).

[Patent Citation 1] JP-A-2003-142976

However, when aluminum is used as the getter material, there is a concern that a decline in quality of the piezoelectric vibrator and a change in property may be caused. That is, aluminum has a property of being easily chemically eroded by a medium such as moisture. For that reason, when the piezoelectric vibrator is under high humidity, there is a chance that the getter material is corroded by the humidity. When corrosion occurs, the surface of the getter material can be radically etched or corrosion products may appear on the surface. For that reason, there is a concern that a decline in quality is caused, and the vibration operation of the piezoelectric vibrating reed is affected, and a change in property is caused.

The present invention is made in view of the above circumstances, and an object thereof is to provide a piezoelectric vibrator that can exhibit the high gettering effect and does not cause quality decline or property change by the influence of humidity. Furthermore, it is possible to provide a piezoelectric manufacturing method to manufacture the piezoelectric vibrator, and to provide an oscillator, electronic equipment and a radio-controlled timepiece having the piezoelectric vibrator.

SUMMARY OF THE INVENTION

The invention provides the following means to solve the above-mentioned object and achieve the related object:

(1) According to the invention there is provided a method of manufacturing a piezoelectric vibrator which includes a base substrate and a lid substrate which are bonded to each other with a cavity formed therebetween, an external electrode that is formed on a lower surface of the base substrate, an internal electrode that is formed on an upper surface of the base substrate so as to be accommodated in the cavity, a through electrode which is formed so as to pass through the base substrate and electrically connect the external electrode with the internal electrode, a piezoelectric vibrating reed which is accommodated in the cavity in a state of being electrically connected to the internal electrode, and a getter material that is formed in the cavity, the getter material being formed of chromium or a metallic material consisting of chromium as a main ingredient.

According to the method of manufacturing the piezoelectric vibrator, since the getter material is formed of chromium or a metallic material consisted of chromium as a main ingredient, a high corrosion resistance can be exhibited. That is, since chromium is superior to aluminum in corrosion resistance, it is possible to further improve the corrosion resistance of the getter material compared to a case of being formed of aluminum of the related art. For that reason, even if the piezoelectric vibrator is used under the circumstance of high humidity, the getter material is not easily corroded. Thus, the quality decline or the property change due to corrosion is not caused.

In addition, since chromium has superior corrosion resistance and is easily combined with oxygen, at the time of gettering, when the getter material is heated and evaporated, the gas mainly consisting of oxygen in the cavity is easily absorbed and the gettering effect is high. That is, it is possible to expect the gettering effect that is equal to or more than the getter material of the related art formed of aluminum. For that reason, since the degree of vacuum in the cavity can be improved in a short time, the piezoelectric vibrator can be manufactured effectively.

(2) Furthermore, the getter material may be formed on the upper surface of the base substrate.

In this case, the getter material is formed in any one substrate of the base substrate or the lid substrate not the piezoelectric vibrating reed. Thus, at the time of gettering, even when the getter material is heated by a laser or the like, the piezoelectric vibrating reed is not affected by the heating. Accordingly, the load due to the heating is not applied to the piezoelectric vibrating reed. For that reason, since the quality or the property of the piezoelectric vibrator is not affected, high quality of the piezoelectric vibrator can be promoted.

(3) Furthermore, the internal electrode may be formed of the same material as that of the getter material simultaneously with the getter material.

In this case, since the internal electrode is formed simultaneously with the getter material, the piezoelectric vibrator can be manufactured more effectively.

(4) Furthermore, a piezoelectric vibrator according to the invention includes a base substrate and a lid substrate which are bonded to each other with a cavity formed therebetween, an external electrode that is formed on a lower surface of the base substrate, an internal electrode that is formed on an upper surface of the base substrate so as to be accommodated in the cavity, a through electrode which is formed so as to pass through the base substrate and electrically connect the external electrode with the internal electrode, a piezoelectric vibrating reed which is accommodated in the cavity in a state of being electrically connected to the internal electrode, and a getter material that is formed in the cavity, the getter material being formed of chromium or a metallic material consisting of chromium as a main ingredient.

In this case, it is possible to obtain the same working effect as the method of manufacturing the piezoelectric vibrator described in the above item (1).

(5) Furthermore, the getter material may be formed on the upper surface of the base substrate.

In this case, it is possible to obtain the same working effect as the method of manufacturing the piezoelectric vibrator described in the above item (2).

(6) The internal electrode may be formed of the same material as that of the getter material simultaneously with the getter material.

In this case, it is possible to obtain the same working effect as the method of manufacturing the piezoelectric vibrator described in the above item (3).

(7) Furthermore, an oscillator according to the invention is configured so that the piezoelectric vibrator described in any one of the above items (4) to (6) is electrically connected to an integrated circuit as an oscillating element.

(8) Furthermore, electronic equipment according to the invention is configured so that the piezoelectric vibrator described in any one of the above items (4) to (6) is electrically connected to a measurement portion.

(9) Furthermore, a radio-controlled timepiece according to the invention is configured so that the piezoelectric vibrator described in any one of the above items (4) to (6) is electrically connected to a filter portion.

With the oscillator, the electronic equipment and the radio-controlled timepiece, since they include the piezoelectric vibrator which does not cause any quality decline or property change and are of high quality and high reliability even when being used in a situation of high humidity, similarly, it is possible to enhance the reliability of the operation and promote high quality.

With the piezoelectric vibrator according to the invention, high gettering effect can be exhibited, which makes it possible to avoid any quality decline or property change by the influence of humidity. Thus, the reliability of the operation can be promoted.

Furthermore, with the method of manufacturing the piezoelectric vibrator according to the invention, the above-mentioned piezoelectric vibrator can be reliably manufactured.

Moreover, with the oscillator, the electronic equipment and the radio-controlled timepiece according to the invention, since they include the above-mentioned piezoelectric vibrator, similarly, it is possible to enhance the reliability of the operation and promote high quality.

BRIEF DESCRIPTION OF THE DRAWINGS

FIG. 17 is a table that shows a result of the embodiment using the piezoelectric vibrator according to the invention.

DETAILED DESCRIPTION OF THE PREFERRED EMBODIMENTS

Figure 1:
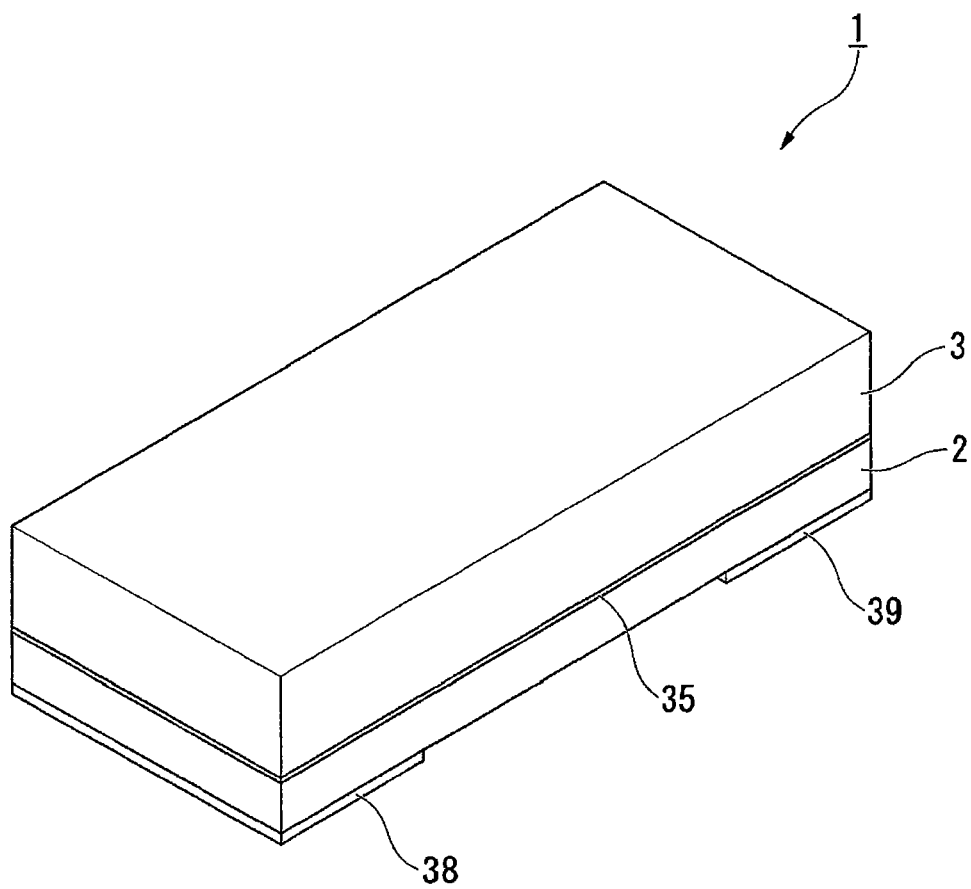
FIG. 1 is an exterior perspective view of a piezoelectric vibrator that shows an embodiment of the invention.

Hereinafter, an embodiment of a piezoelectric vibrator according to the invention will be explained with reference to FIGS. 1 to 13.

As shown in FIGS. 1 to 5, a piezoelectric vibrator 1 of the present embodiment is formed in the shape of a box, in which a base substrate 2 and a lid substrate 3 are stacked as two layers, and is an SMD type piezoelectric vibrator in which a piezoelectric vibrating reed 4 is accommodated within a cavity C of an inner portion thereof.

Furthermore, in FIG. 5, in order to make the drawings easier to see, excitation electrodes 15, lead-out electrodes 19 and 20, mount electrodes 16 and 17, and a weight metal film 21 described later are omitted.

Figure 6:
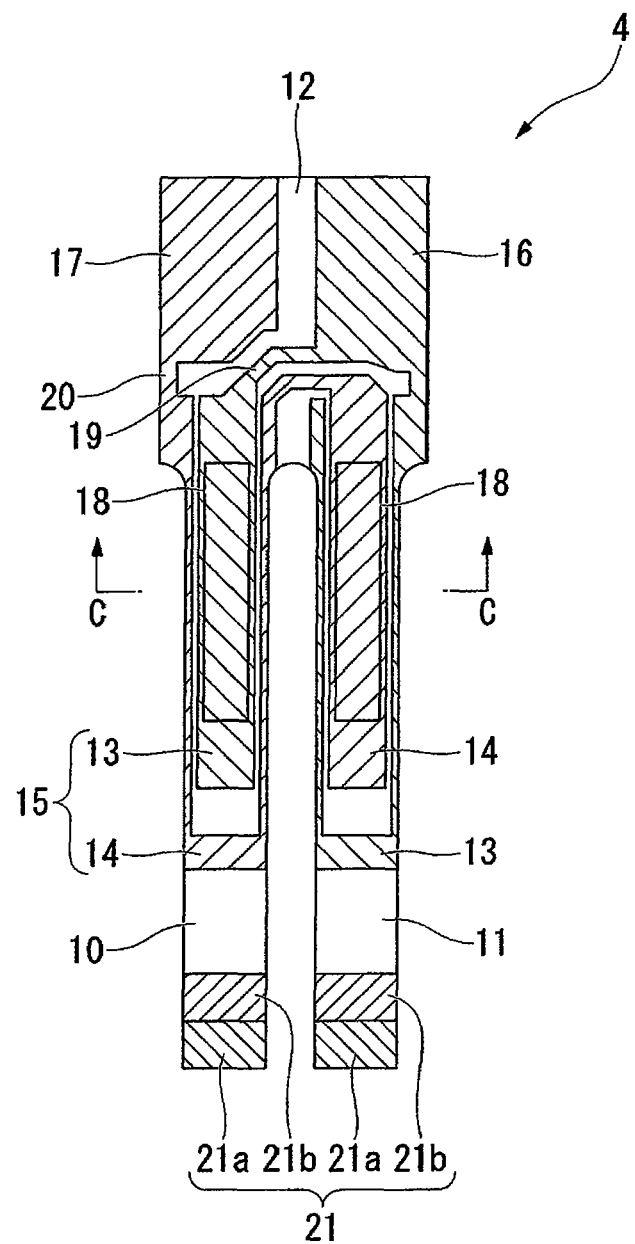
FIG. 6 is a plan view of a piezoelectric vibrating reed constituting the piezoelectric vibrator shown in FIG. 1.
Figure 7:
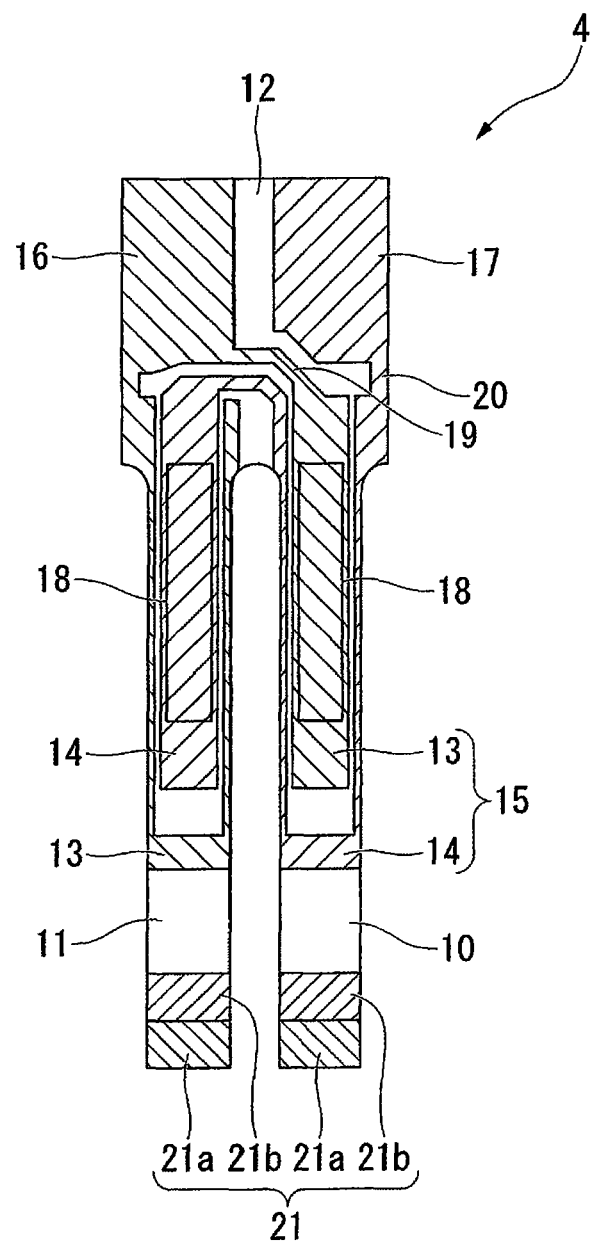
FIG. 7 is a view from below of the piezoelectric vibrating reed shown in FIG. 6.
Figure 8:
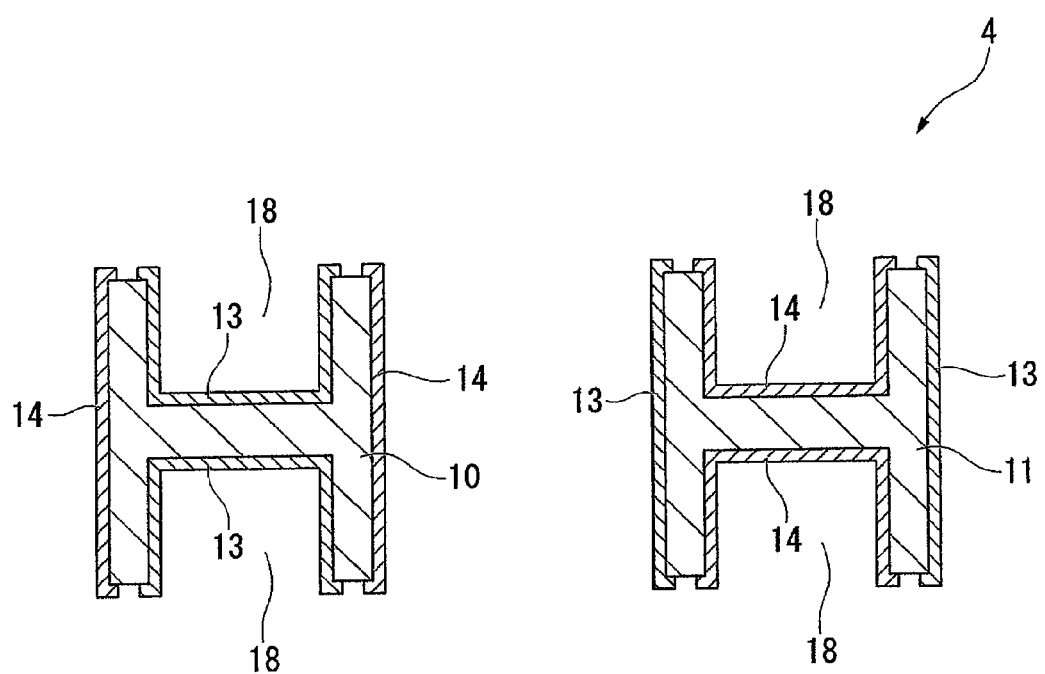
FIG. 8 is a cross-sectional view taken from arrows C-C shown in FIG. 6.

As shown in FIGS. 6 to 8, the piezoelectric vibrating reed 4 is a tuning fork type vibrating reed formed of piezoelectric materials such as crystal, lithium tantalite or lithium niobate, and is vibrated when a predetermined voltage is applied.

The piezoelectric vibrating reed 4 has a pair of vibration arm portions 10 and 11 extending in parallel, a base portion 12 that integrally fixes proximal end sides of the pair of vibration arm portions 10 and 11, an excitation electrode 15 including a first excitation electrode 13 and a second excitation electrode 14 and is formed on outer surfaces of the pair of vibration arm portions 10 and 11 to vibrate the pair of vibration arm portions 10 and 11, and mount electrodes 16 and 17 that are electrically connected to the first excitation electrode 13 and the second excitation electrode 14.

In addition, the piezoelectric vibrating reed 4 of the present embodiment includes groove portions 18 that are formed on both main surfaces of the pair of vibration arm portions 10 and 11 along a longitudinal direction of the vibration arm portions 10 and 11, respectively. The groove portions 18 are formed from the proximal end sides of the vibration arm portions 10 and 11 up to approximately near a middle portion.

The excitation electrodes 15 including the first excitation electrode 13 and the second excitation electrode 14 are electrodes that vibrate the pair of vibration arm portions 10 and 11 in a direction approaching and retracting from each other by a predetermined resonant frequency, and are patterned and formed on the outer surfaces of the pair of vibration arm portions 10 and 11 in a state of being electrically separated, respectively. Specifically, as shown in FIG. 8, the first excitation electrode 13 is mainly formed on the groove portions 18 of one vibration arm portion 10 and on both side surfaces of the other vibration arm portion 11, and the second excitation electrode 14 is mainly formed on both side surfaces of one vibration arm portion 10 and on the groove portions 18 of the other vibration arm portion 11.

Furthermore, as shown in FIGS. 6 and 7, the first excitation electrode 13 and the second excitation electrode 14 are electrically connected to the mount electrodes 16 and 17 via the lead-out electrodes 19 and 20 on both main surfaces of the base portion 12, respectively. Moreover, the voltage is applied to the piezoelectric vibrating reed 4 via the mount electrodes 16 and 17.

In addition, the excitation electrode 15, the mount electrodes 16 and 17 and the lead-out electrodes 19 and 20 are formed, for example, by the coating of conductive films such as chromium (Cr), nickel (Ni), aluminum (Al) and titanium (Ti).

Furthermore, on the front ends of the pair of vibration arm portions 10 and 11, a weight metal film 21 for adjusting its own vibration state (frequency adjustment) so as to vibrate within a range of a predetermined frequency is coated. In addition, the weight metal film 21 is divided into a rough regulation film 21a used when roughly regulating the frequency and a minute regulation film 21b used when minutely regulating the frequency. By performing the frequency regulation using the rough regulation film 21a and the minute regulation film 21b, it is possible to limit the frequencies of the pair of vibration arm portions 10 and 11 within the range of a nominal frequency of a device.

Figure 3:
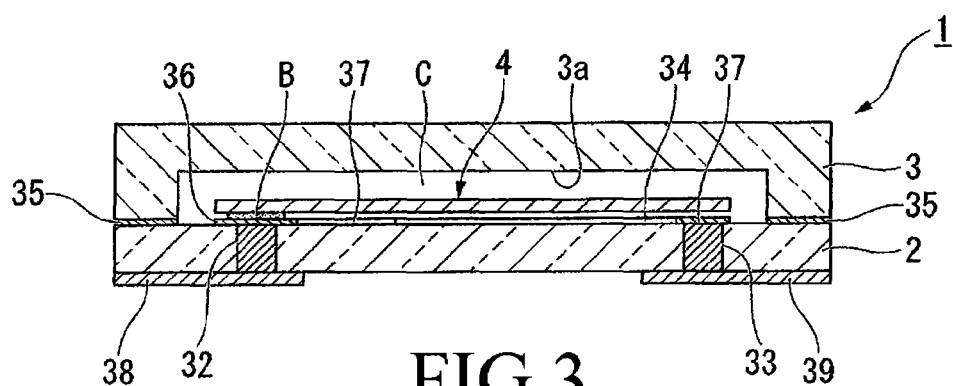
FIG. 3 is a cross-sectional view of the piezoelectric vibrator taken along line A-A shown in FIG. 2.
Figure 5:
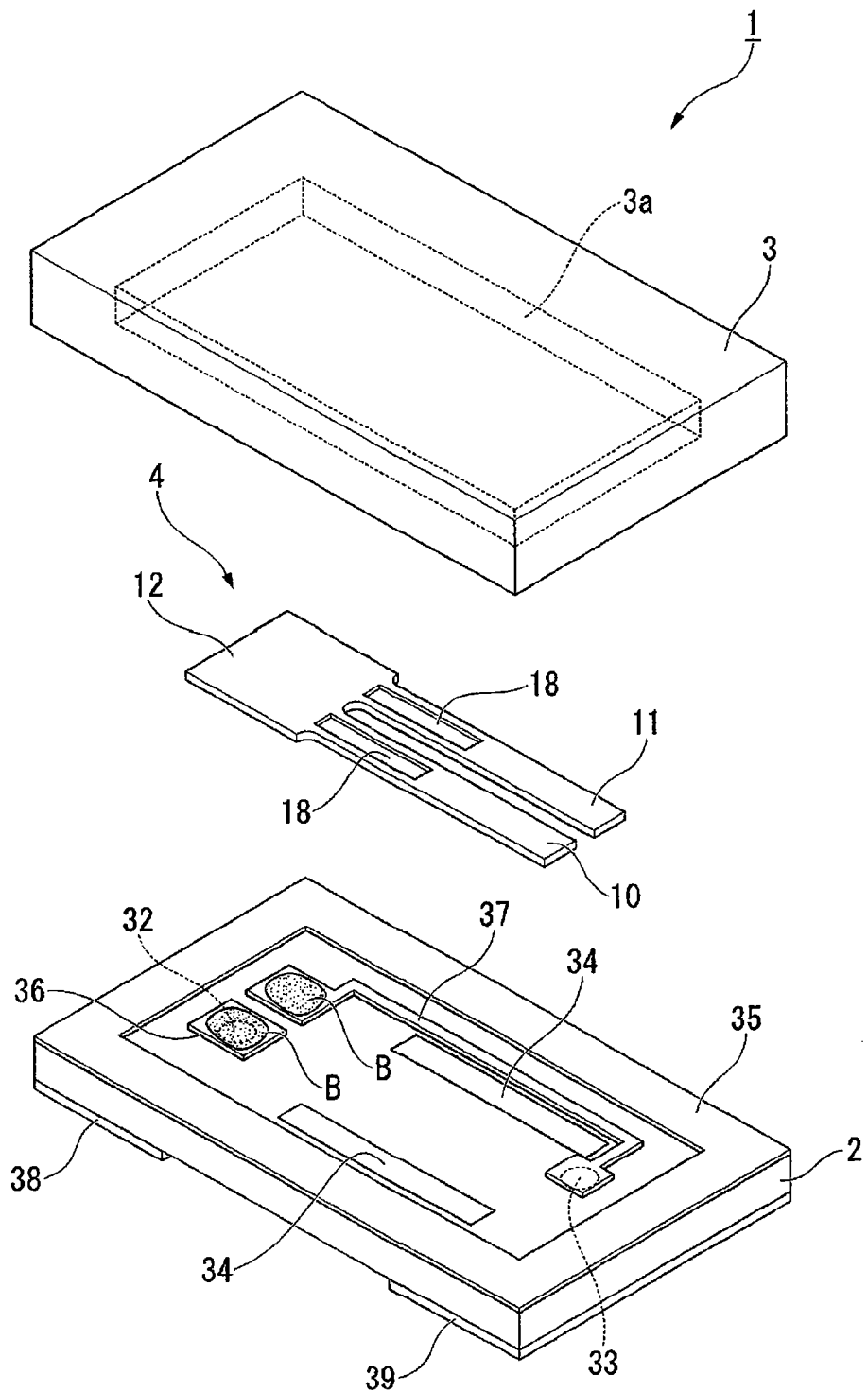
FIG. 5 is an exploded perspective view of the piezoelectric vibrator shown in FIG. 1.

As shown in FIGS. 3 and 5, the piezoelectric vibrating reed 4 configured as above is bump-bonded to the upper surface of the base substrate 2 using a bump B such as gold. More specifically, the pair of mount electrodes 16 and 17 is bump-bonded on two bumps B, which are formed on lead-out electrodes 36 and 37 (internal electrodes) described later patterned on the upper surface of the base substrate 2, respectively, in the contact state. As a result, the piezoelectric vibrating reed 4 is supported in a state floating from the upper surface of the base substrate 2, and the mount electrodes 16 and 17 and the lead-out electrodes 36 and 37 are electrically connected to each other, respectively.

The lid substrate 3 is a transparent insulation substrate formed of a glass material, for example, soda lime glass, and, as shown in FIGS. 1, 3, and 5, is formed in the plate shape. Furthermore, on a bonding surface side to which the base substrate 2 is bonded, a rectangular concave portion 3a into which the piezoelectric vibrating reed 4 enters is formed. The concave portion 3a is a concave portion for the cavity becoming the cavity C which accommodates the piezoelectric vibrating reed 4 when both of the substrates 2 and 3 are overlapped with each other. Moreover, the lid substrate 3 is anode-bonded to the base substrate 2 in a state in which the concave portion 3a is opposed to the base substrate 2 side.

The base substrate 2 is a transparent insulation substrate formed of the same glass material as the lid substrate 3, for example, soda lime glass, and, as shown in FIGS. 1 to 3 and 5, is formed in the shape of a plate and large enough to be able to overlap with the lid substrate 3.

In the base substrate 2, a pair of through holes 32 and 33, which is formed so as to pass through the base substrate 2 in an up and down direction, is formed so that one ends thereof is put into the cavity C, respectively.

The through electrodes 32 and 33 are formed without a gap between them and the base substrate 2, whereby the airtightness in the cavity C is maintained and external electrodes 38 and 39 described later are electrically connected to the lead-out electrodes 36 and 37.

On the upper surface side (a bonding surface side to which the lid substrate 3 is bonded) of the base substrate 2, as shown in FIGS. 1 to 5, a getter material 34 which is formed in the cavity C, improves the degree of vacuum in the cavity C by being heated and is formed of a metallic material, a bonding film 35 for the anode-bonding and a pair of lead-out electrodes 36 and 37 are patterned. Among them, for example, the bonding film 35 is formed of a conductive material such as aluminum and is formed along the periphery of the base substrate 2 so as to surround the periphery of the concave portion 3a formed on the lid substrate 3.

Figure 2:
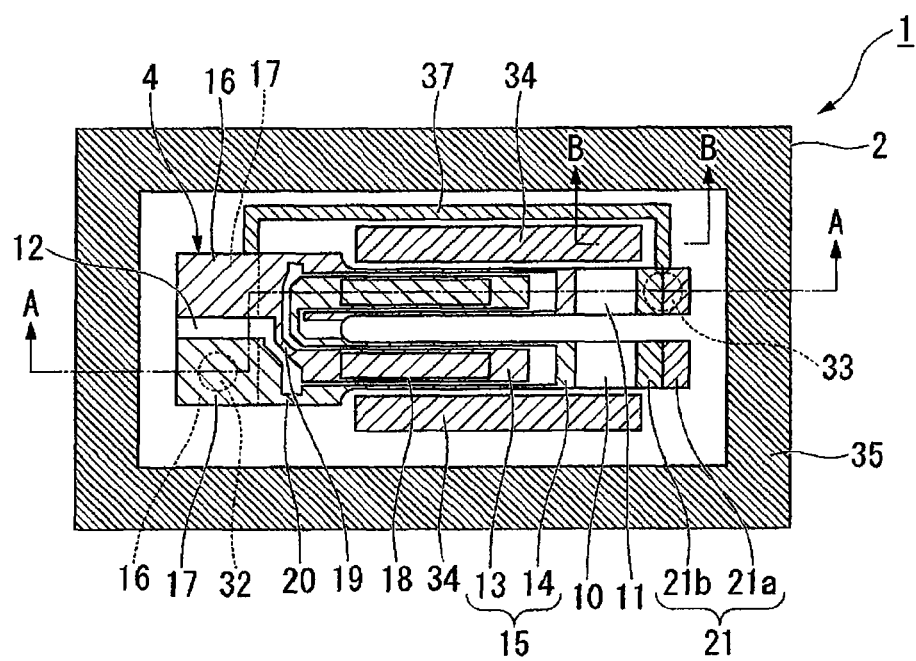
FIG. 2 is an inner configuration diagram of the piezoelectric vibrator shown in FIG. 1 which shows a piezoelectric vibrating reed from above with a lid substrate removed therefrom.
Figure 4:
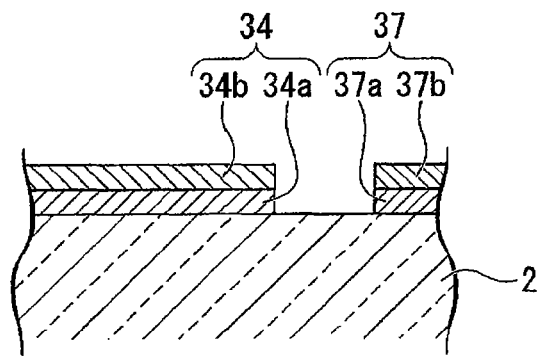
FIG. 4 is a cross-sectional view of the piezoelectric vibrator taken along line B-B shown in FIG. 2.

The getter material 34 is formed of chromium or a metallic material consisting of chromium as a main ingredient. In the present embodiment, as shown in FIG. 4, the getter material 34 includes an under layer 34a formed of chromium which is formed on the base substrate 2, and a gold finish layer 34b formed which is stacked on the under layer 34a. Furthermore, as shown in FIG. 2, two getter materials 34 are formed so as to be oppositely arranged on both sides with the piezoelectric vibrating reed 4 therebetween when seen from the plane. Moreover, the respective getter materials 34 are formed so as to adjoin and extend in parallel to the vibration arm portions 10 and 11 when seen from the plane view.

The pair of lead-out electrodes 36 and 37 is the same materials as that of the getter material 34 and is formed simultaneously with the getter material 34. In the present embodiment, as shown in FIG. 4, the respective lead-out electrodes 36 and 37 includes an under layer 37a formed of chromium which is formed on the base substrate 2, and a gold finish layer 37b formed which is stacked on the under layer 37a. Furthermore, the pair of lead-out electrodes 36 and 37 is patterned so that one lead-out electrode 36 electrically connects one through electrode 32 with one mount electrode 16 of the piezoelectric vibrating reed 4 and the other lead-out electrode 37 electrically connects the other through electrode 33 with the other mount electrode 17 of the piezoelectric vibrating reed 4.

Moreover, as shown in FIGS. 1, 3 and 5, on the lower surface of the base substrate 2, external electrodes 38 and 39, which are electrically connected to the pair of through electrodes 32 and 33, respectively, are formed. That is, one external electrode 38 is electrically connected to the first excitation electrode 13 of the piezoelectric vibrating reed 4 via one through electrode 32 and one lead-out electrode 36. Furthermore, the other external electrode 39 is electrically connected to the second excitation electrode 14 of the piezoelectric vibrating reed 4 via the other through electrode 33 and the other lead-out electrode 37. As a consequence, the pair of excitation electrodes 15 can be electrically connected to the outside of the cavity C, respectively.

In the case of operating the piezoelectric vibrator 1 configured as above, a predetermined driving voltage is applied to the external electrodes 38 and 39 formed on the base substrate 2. As a result, it is possible to make the electric current flow to the excitation electrodes 15 including the first excitation electrode 13 and the second excitation electrode 14 of the piezoelectric vibrating reed 4, which makes it possible to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

Figure 9:
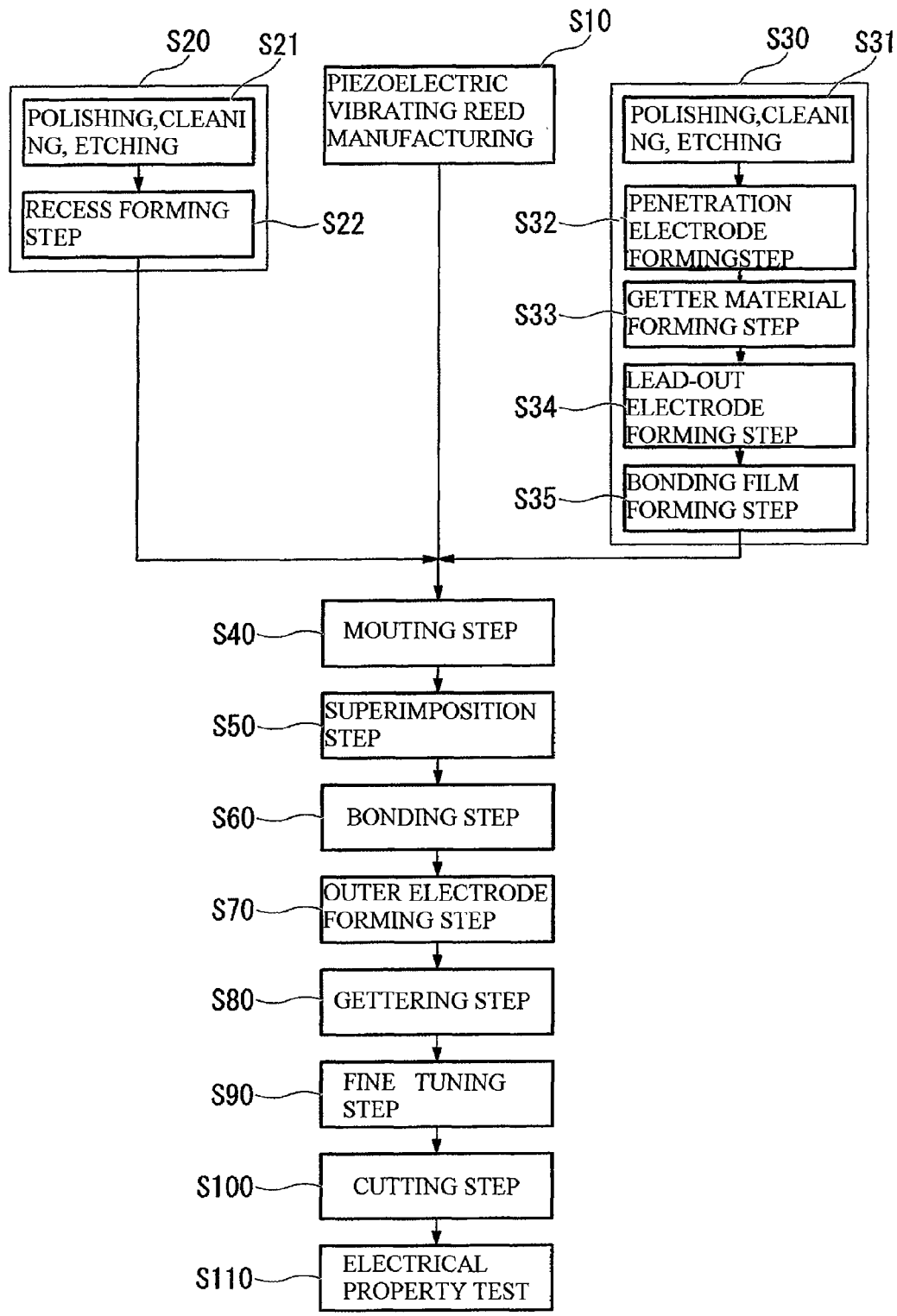
FIG. 9 is a flow chart that shows the flow of manufacturing the piezoelectric vibrator shown in FIG. 1.

Next, a method of manufacturing a plurality of above-mentioned piezoelectric vibrators 1 using a base substrate wafer (a base substrate) 40 and a lid substrate wafer (a lid substrate) 50 at a time will be explained with reference to the flow chart shown in FIG. 9. In addition, in the present embodiment, a plurality of piezoelectric vibrators 1 is manufactured at a time using the wafer-shaped substrate, but the invention is not limited thereto, and one, in which the size thereof is matched to the exterior shape of the base substrate 2 and the lid substrate 3, is worked in advance, a piezoelectric vibrator may be manufactured one at a time.

Firstly, as a piezoelectric vibrating reed production process, the piezoelectric vibrating reed 4 shown in FIGS. 6 to 8 is manufactured (S10). Specifically, firstly, a crystal Lambert gemstone is sliced at a predetermined angle to make a wafer of a fixed thickness. Next, after the wafer is wrapped and is subjected to rough working, a deformed layer is removed by the etching, and then a mirror surface polishing such as a polish is performed, thereby making a wafer of a predetermined thickness. Next, after the wafer is subjected to suitable processing such as cleaning, the wafer is patterned by a photolithograph technique or the like to the exterior shapes of the piezoelectric vibrating reed 4, and the film formation and the patterning of the metallic film are performed, thereby forming the excitation electrode 15, the lead-out electrodes 19 and 20, the mount electrodes 16 and 17 and the weight metal film 21. As a result, a plurality of piezoelectric vibrating reeds 4 can be produced.

Furthermore, after producing the piezoelectric vibrating reed 4, the rough regulation of the resonance frequency is performed. This is performed by irradiating the rough regulation film 21a of the weight metal film 21 with laser beam to evaporate a part thereof and changing the weight thereof. In addition, a minute regulation, in which the resonance frequency is further accurately regulated, is performed after the mounting. This will be described later.

Figure 10:
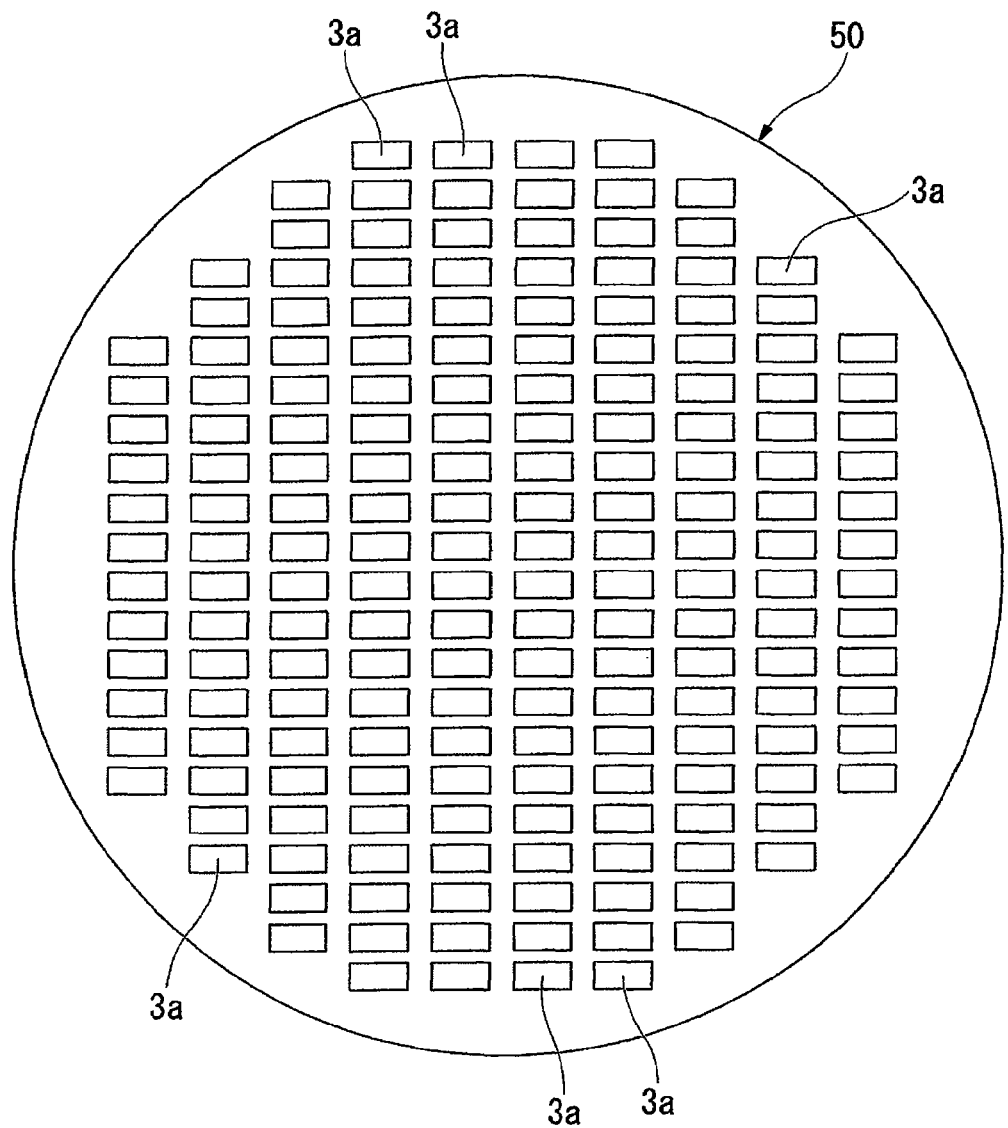
FIG. 10 is a diagram showing a process of manufacturing the piezoelectric vibrator according to a flow chart shown in FIG. 9 which shows a state in which a plurality of concave portions, is formed in a lid substrate wafer that becomes a source of the lid substrate.

Next, at the timing simultaneously with or before and after the piezoelectric vibrating reed manufacturing process, as a first wafer producing process, the lid substrate wafer 50 that becomes the lid substrate 3 later is produced up to a state immediately before performing an anode-bonding (S20). Firstly, after the soda lime glass is polished up to a predetermined thickness and is cleaned, a circular plate shaped lid substrate wafer 50, in which the deformed layer of the uppermost surface is removed by etching or the like, is formed (S21). Next, as a concave portion forming process, as shown in FIG. 10, a plurality of concave portions 3a for the cavity is formed on the bonding surface of the lid substrate wafer 50 in a column and row direction (S22) by the etching or the like. At this time, the first wafer producing process is finished.

Next, at the timing simultaneously with or immediately before and after the first wafer producing process, as a second wafer producing process, the base substrate wafer 40 that becomes the base substrate 2 later is produced up to a state immediately before performing an anode-bonding (S30). Firstly, similarly to the lid substrate wafer 50, after the soda lime glass is polished up to a predetermined thickness and is cleaned, the base substrate wafer 40 is formed from a circular plate shaped soda lime glass, in which the deformed layer of the uppermost surface is removed by the etching or the like (S31).

Next, as a through electrode forming process, a plurality of pairs of through electrodes 32 and 33 is formed on the base substrate wafer 40 (S32). At this time, for example, after forming a plurality of pairs of through holes, which passes through the base substrate wafer 40 in the up and down direction, by sand blasting, press working or the like, the pair of through electrodes 32 and 33 is formed in the plurality of through holes. By the pair of through electrodes 32 and 33, the conductivity of the upper surface side and the lower surface side of the base substrate wafer 40 is secured.

Next, as a getter material forming process, the getter material 34 is formed (S33) and, simultaneously, as a lead-out electrode forming process, the lead-out electrodes 36 and 36 are formed (S34). At this time, for example, firstly, after the under layers 34a and 37a formed of chromium are patterned, the patterning is performed so that the gold finish layers 34b and 37b formed are stacked on the under layers 34a and 37a. Furthermore, when patterning the under layer 34a, when the piezoelectric vibrating reed 4 is mounted on the base substrate wafer 40 later, two getter materials 34 are formed so as to be oppositely arranged on both sides with the piezoelectric vibrating reed 4 pinched therebetween when seen from the plane, and the respective getter materials 34 are formed so as to adjoin and extend in parallel with the vibration arm portions 10 and 11 when seen from the plane.

Particularly, since the lead-out electrodes 36 and 37 are formed simultaneously with the getter material 34, the piezoelectric vibrator 1 can further effectively be manufactured. In addition, since gold is used as the finish layer 37b of the lead-out electrodes 36 and 37, the conductivities of the lead-out electrodes 36 and 37 can stably be secured, and the quality of the piezoelectric vibrator 1 can be improved.

Figure 11:
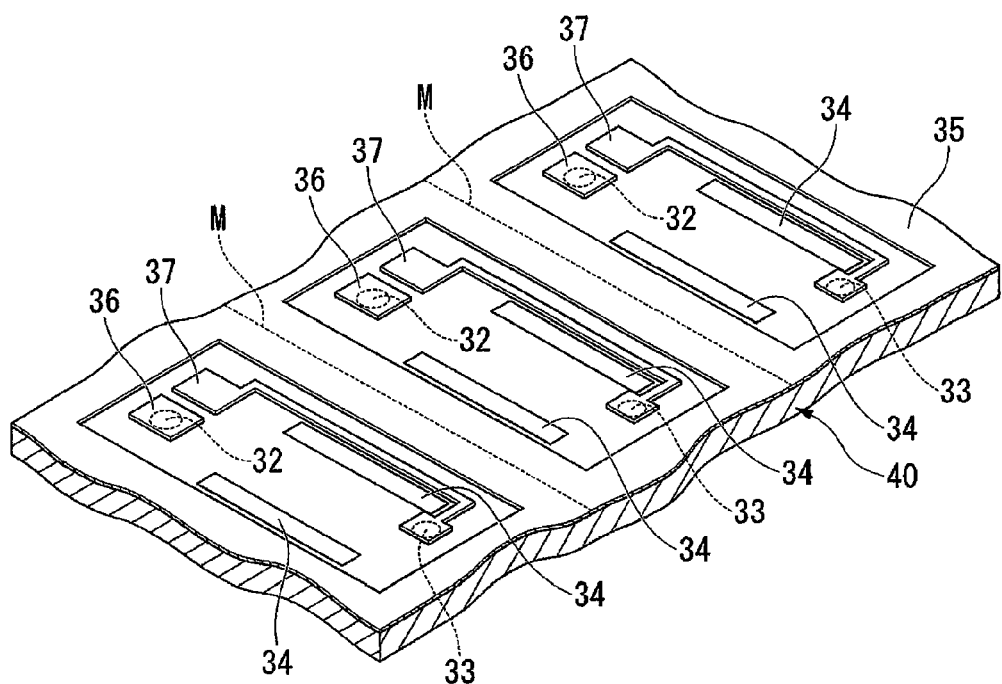
FIG. 11 is a diagram showing a process of manufacturing the piezoelectric vibrator according to a flow chart shown in FIG. 9 which shows a state in which a getter material, a bonding film, and a lead-out electrode is patterned in a base substrate wafer that becomes a source of the base substrate.
Figure 12:
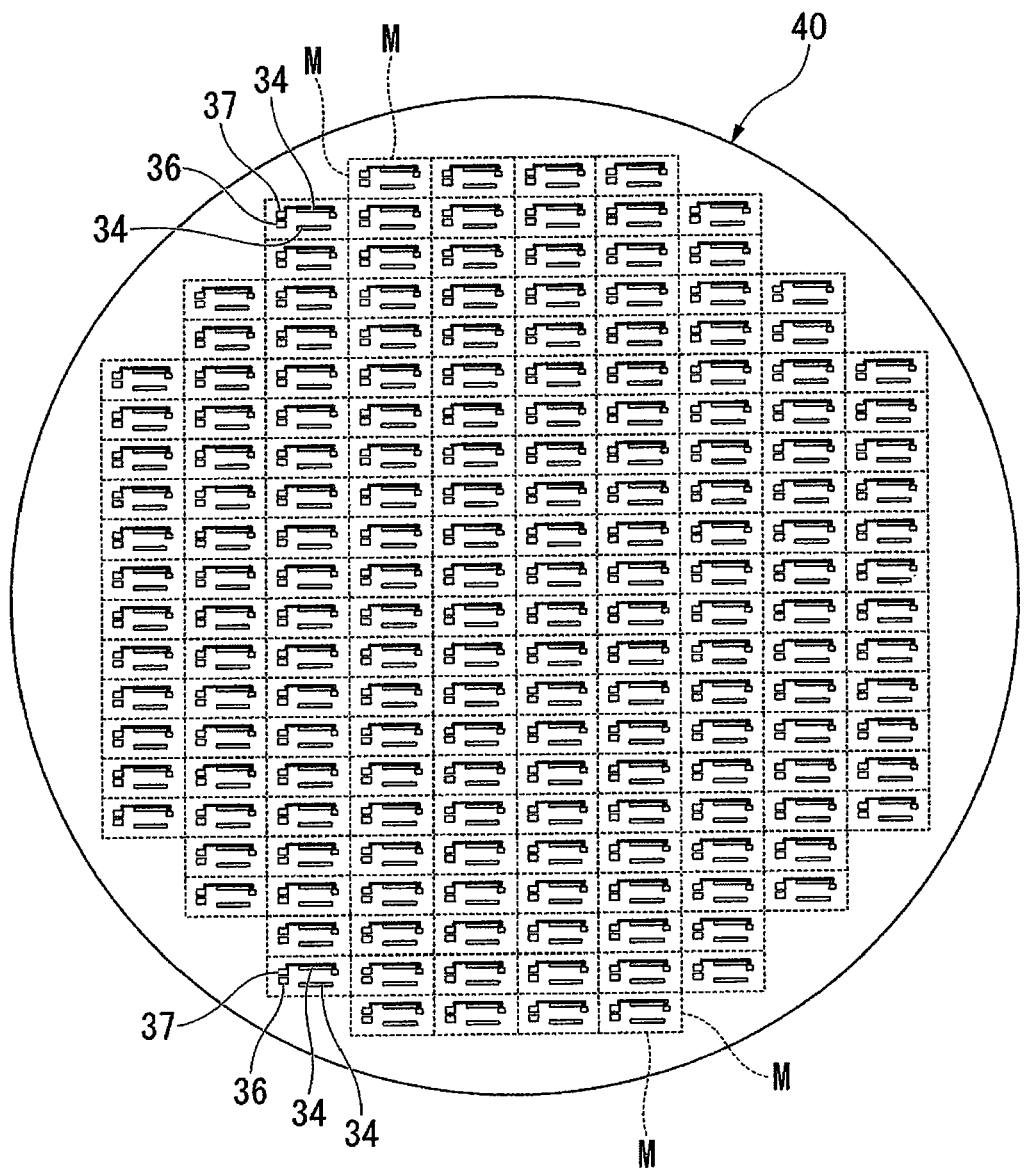
FIG. 12 is an overall diagram of the base substrate wafer of the state shown in FIG. 11.

Next, as a bonding film forming process, a conductive material is patterned on the upper surface of the base substrate wafer 40, thereby forming the bonding film 35, as shown in FIGS. 11 and 12 (S35). In addition, the dash lines M shown in FIGS. 11 and 12 show the cutting lines which are cut in a cutting process performed later. Furthermore, in FIG. 12, the bonding film 35 is omitted so as to easily view the drawing.

At this point in time, the second wafer producing process is finished.

Next, as a mount process, a plurality of produced piezoelectric vibrating reeds 4 is bonded to the upper surface of the base substrate wafer 40 via the lead-out electrodes 36 and 37, respectively (S40). At this time, firstly, the bump B such as gold is formed on the pair of lead-out electrodes 36 and 37, respectively. Moreover, after the base portion 12 of the piezoelectric vibrating reed 4 is mounted on the bump B, the piezoelectric vibrating reed 4 is pressed to the bump B while heating the bump B at a predetermined temperature (for example, 300° C.). As a result, the piezoelectric vibrating reed 4 is mechanically supported on the bump B, and the mount electrodes 16 and 17 and the lead-out electrodes 36 and 37 are electrically connected to each other. Thus, at this point in time, the pair of excitation electrodes 15 of the piezoelectric vibrating reed 4 is electrically connected to the pair of through electrodes 32 and 33, respectively.

After the mount of the piezoelectric vibrating reed 4 is finished, as an overlapping process, the lid substrate wafer 50 is overlapped with the base substrate wafer 40 (S50). Specifically, both wafers 40 and 50 are aligned in the correct position while setting a standard mark (not shown) as an index. As a result, the piezoelectric vibrating reed 4, the getter material 34, and the lead-out electrodes 36 and 37 are accommodated within the cavity C which is surrounded by the concave portion 3a formed on the base substrate wafer 40 and both wafers 40 and 50.

Figure 13:
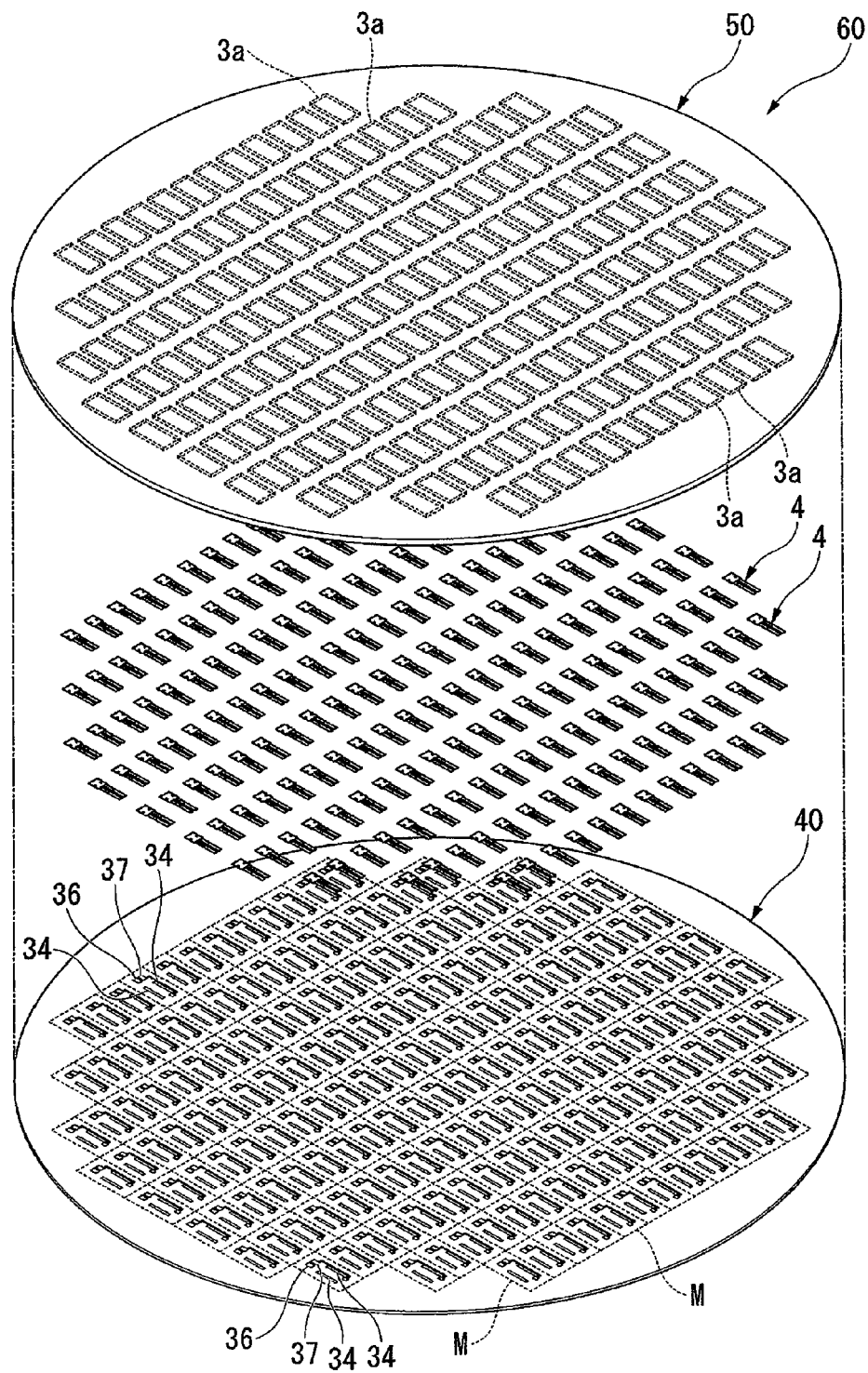
FIG. 13 is a diagram showing a process of manufacturing the piezoelectric vibrator according to a flow chart shown in FIG. 9 which shows an exploded perspective view of a wafer body in which the base substrate wafer and the lid substrate wafer are subjected to an anode-bonding in a state in which the piezoelectric vibrating reed is accommodated in the cavity.

After the overlapping process, as a bonding process, the two overlapped wafers 40 and 50 are put in an anode-bonding device (not shown) and a predetermined voltage is applied at a predetermined temperature environment to perform the anode-bonding (S60). Specifically, a predetermined voltage is applied between the bonding film 35 and the lid substrate wafer 50. Then, an electrochemical reaction occurs in an interface between the bonding film 35 and the lid substrate wafer 50, and both of them are strongly bonded to each other and are subjected to the anode-bonding. As a result, the piezoelectric vibrating reed 4 can be sealed within the cavity C, and it is possible to obtain a wafer body 60 shown in FIG. 13 in which the base substrate wafer 40 and the lid substrate wafer 50 are bonded to each other. In addition, in FIG. 13, in order to make the drawing easier to see, the wafer body 60 is shown in an exploded state, and the bonding film 35 from the base substrate wafer 40 is omitted. In addition, the dash lines M shown in FIG. 13 show the cutting lines which are cut in a cutting process performed later.

Next, as an external electrode forming process, a conductive material is patterned on the lower surface of the base substrate wafer 40, and a plurality of pairs of external electrodes 38 and 39 electrically connected to the pair of through electrodes 32 and 33, respectively, is formed (S70). By this process, it is possible to operate the piezoelectric vibrating reed 4 accommodated in the cavity C using the external electrodes 38 and 39.

Next, as a gettering process, the getter material 34 accommodated in the respective cavities C of the wafer body 60 is heated to adjust the degree of vacuum within the cavities C (S80). Specifically, the wafer body 60 is set in a gettering adjuster (not shown), and a predetermined voltage is applied to the external electrodes 38 and 39 in the gettering adjuster to vibrate the piezoelectric vibrating reed 4, thereby measuring a series vibration resistance value that is in a proportional relationship with the equivalent resistance value. Based on the series resonance resistance value, for example, by irradiating a laser from the base substrate wafer 40 side, the getter material 34 is heated to perform the gettering a suitable number of times.

In addition, as a method of deciding the suitable number of times for the gettering, for example, a method in which the threshold value of the series resonance resistance value is set for each type of the piezoelectric vibrator in advance, and is decided to be suitable when it is lower than the threshold value, may be adopted. In addition, the series resonance resistance value immediately before the gettering is stored and the gettering is performed, a rate of change between it and the series resonance resistance value immediately after the gettering is calculated, whereby the decision may be made by comparing the rate of the change to a preset value.

Next, in the state of the wafer body 60, as a minute regulation process, the frequency of the respective piezoelectric vibrating reed 4 sealed in the cavity C is minutely adjusted to limit the same within a predetermined range (S90). To explain specifically, the voltage is applied to the pair of external electrodes 38 and 39 formed on the lower surface of the base substrate wafer 40 to vibrate the voltage vibrating reed 4. Moreover, laser beam is irradiated from the outside through the base substrate wafer 40 while measuring the frequency, thereby evaporating the minute regulation film 21b of the weight metal film 21. As a result, the weight of the front end sides of the pair of vibration arm portions 10 and 11 is changed, which makes it possible to minutely regulate the frequency of the piezoelectric vibrating reed 4 so as to be punt into a predetermined range of the nominal frequency.

After the minute regulation of the frequency is finished, as a cutting process, the bonded wafer body 60 is cut along the cutting lines M shown in FIG. 13 to form small pieces (S100). As a result, it is possible to manufacture a plurality of SMD type piezoelectric vibrators 1 having a two layer structure type in which the piezoelectric vibrating reed 4 is accommodated in the cavity C formed between the base substrate 2 and the lid substrate 3 that are bonded to each other shown in FIG. 1 at a time.

In addition, after the cutting process (S100) is performed to form the small pieces to the respective piezoelectric vibrators 1, the minute regulation process (S90) may be performed. However, as described above, by performing the minute regulation process (S90) in advance, the minute regulation can be performed in the state of the wafer body 60, which makes it possible to more effectively and minutely regulate the plurality of piezoelectric vibrators 1. Accordingly, it is desirable in that an improvement in throughput can be promoted.

After that, an internal electrical property inspection is performed (S110). That is, the resonant frequency, the resonant resistance value, the drive level property (an excitation electric power dependence of the resonant frequency and the resonant resistance value) or the like of the piezoelectric vibrating reed 4 are measured and checked. Furthermore, the insulation resistance property or the like is jointly checked. Moreover, the exterior inspection of the piezoelectric vibrator 1 is performed last, and the size, the quality or the like are finally checked. As a result, the manufacturing of the piezoelectric vibrator 1 is finished.

Particularly, since the getter material 34 includes the under layer 34a formed of chromium, a high corrosion resistance can be exhibited. That is, since chromium is superior to aluminum in corrosion resistance, it is possible to further improve the corrosion resistance of the getter material 34 compared to a case of being formed of aluminum of the related art. For that reason, even if the piezoelectric vibrator 1 is used under a circumstance of high humidity, the getter material 34 is not easily corroded. Thus, any quality decline or property change due to the corrosion is not caused. Thus, the reliability of the operation can be improved.

In addition, since chromium has superior corrosion resistance and is easily combined with oxygen, at the time of gettering, when the getter material 34 is heated and evaporated, the gas mainly consisted of oxygen in the cavity C is easily absorbed, and the gettering effect is high. That is, it is possible to expect the gettering effect that is equal to or more than the getter material of the related art formed of aluminum. For that reason, since the degree of vacuum in the cavity C can be improved in a short time, the piezoelectric vibrator 1 can be manufactured effectively.

In addition, the getter material 34 is formed on the base substrate wafer 40 (the base substrate 2) not on the piezoelectric vibrating reed 4. Accordingly, when performing the gettering, even if the getter material 34 is heated by a laser or the like, the piezoelectric vibrating reed 4 is not affected by the heating. Thus, the load due to the heating is not applied to the piezoelectric vibrating reed 4. For this reason, since the quality or the property of the piezoelectric vibrator 1 is not affected, high quality of the piezoelectric vibrator 1 can be promoted even in this point.

Next, an embodiment of the oscillator according to the invention will be explained with reference to FIG. 14.

Figure 14:
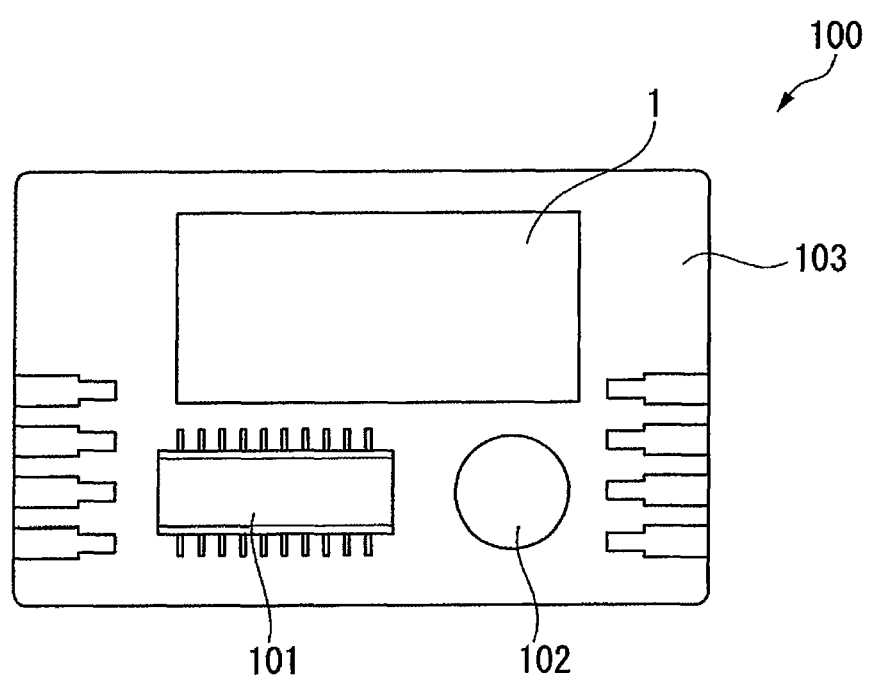
FIG. 14 is a configuration diagram showing an embodiment of an oscillator according to the invention.

As shown in FIG. 14, an oscillator 100 of the present embodiment is constituted as an oscillating element in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to the electric signal by the piezoelectric property of the piezoelectric vibrating reed 4 and is input in the integrated circuit 101 as the electric signal. The input electric signal is subjected to the respective processing by the integrated circuit 101 and is output as the frequency signal. As a result, the piezoelectric vibrator 1 functions as the oscillator.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like can be added.

As mentioned above, according to the oscillator 100 of the present embodiment, since it includes the piezoelectric vibrator 1 of a high quality with an improved operational reliability, the oscillator 100 itself also can improve the operational reliability to promote high quality. Additionally, it is possible to obtain the high precision frequency signal that is stable over a long period of time.

Figure 15:
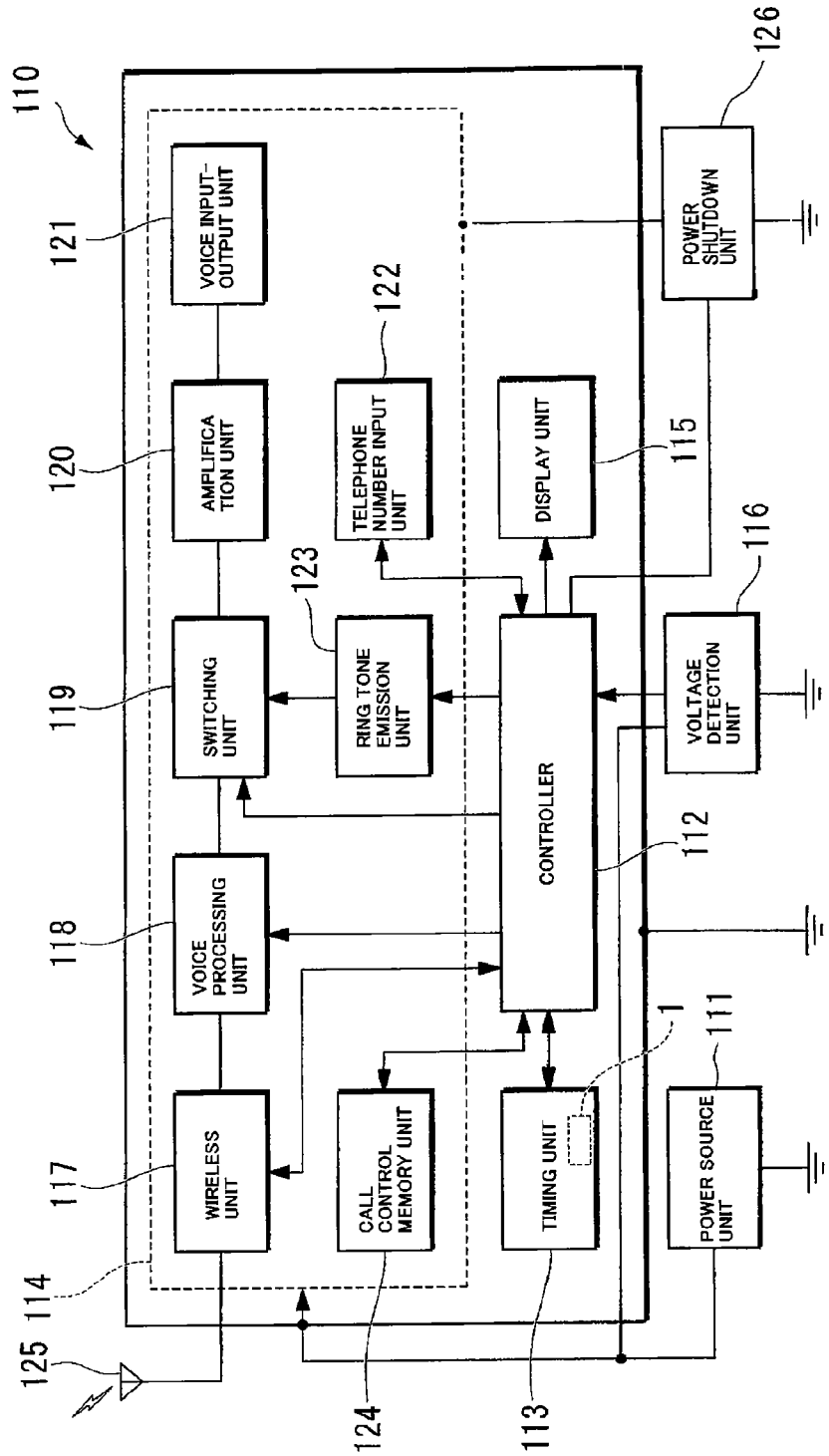
FIG. 15 is a configuration diagram showing an embodiment of electronic equipment according to the invention.

Next, an embodiment of the electronic equipment according to the invention will be explained with reference to FIG. 15. Furthermore, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to the wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 15, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with the electric power by the power source portion 111.

The control portion 112 controls the respective functional portions to perform the operational control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, a register circuit, a counter circuit, interface circuit or the like, and the piezoelectric vibrator 1. When the voltage is applied to the piezoelectric vibrator 1, the piezoelectric vibrating reed 4 is vibrated and the vibration is converted to the electric signal by the piezoelectric property of crystal, and is input to the oscillation circuit as the electric signal. The output of the oscillation circuit is binarized and is counted by the resister circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a ring tone generation portion 123, and a call control memory portion 124.

The wireless portion 117 performs the exchange of the transmission and the reception of various data such as sound data with a base station via an antenna 125. The sound processing portion 118 encodes and decrypts the sound signal input from the wireless portion 117 or the amplification portion 120. The amplification portion 120 amplifies the signal, which is input from the sound processing portion 118 or the sound input and output portion 121, to a predetermined level. The sound input and output portion 121 includes a speaker, a microphone or the like, amplifies the ring tone or the receipt sound, or collect the sound.

Furthermore, the ring tone generation portion 123 creates the ring tone according to calls from the base station. The switch-over portion 119 switches the amplification portion 120 connected to the sound processing portion 118 to the ring tone generation portion 123 only when receiving, whereby the ring tone created in the ring tone generation portion 123 is output to the sound input and output portion 121 via the amplification portion 120.

In addition, the call control memory portion 124 stores the program relating to the departure and the arrival control of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the ring tone generation portion 123. Particularly, stopping the operation of the wireless portion 117 having a high rate of electric power consumption is essential. Furthermore, the intent that the communication portion 114 becomes unusable due to the lack of the battery residual quantity is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) mark may be made on a phone icon displayed on the upper portion of the display surface of the display portion 115.

In addition, the power source shut-off portion 126 which can selectively shut off the power source of the portion relating to the function of the communication portion 114 is included, whereby the function of the communication portion 114 can further reliably be stopped.

As mentioned above, according to the portable information equipment 110 of the present embodiment, since it includes the piezoelectric vibrator 1 of a high quality with an improved operational reliability, the portable information equipment itself also can improve the operational reliability to promote high quality. Additionally, it is possible to display the high precision timepiece information which is stable for a long period of time.

Next, an embodiment of a radio-controlled timepiece according to the invention will be explained with reference to FIG. 16.

Figure 16:
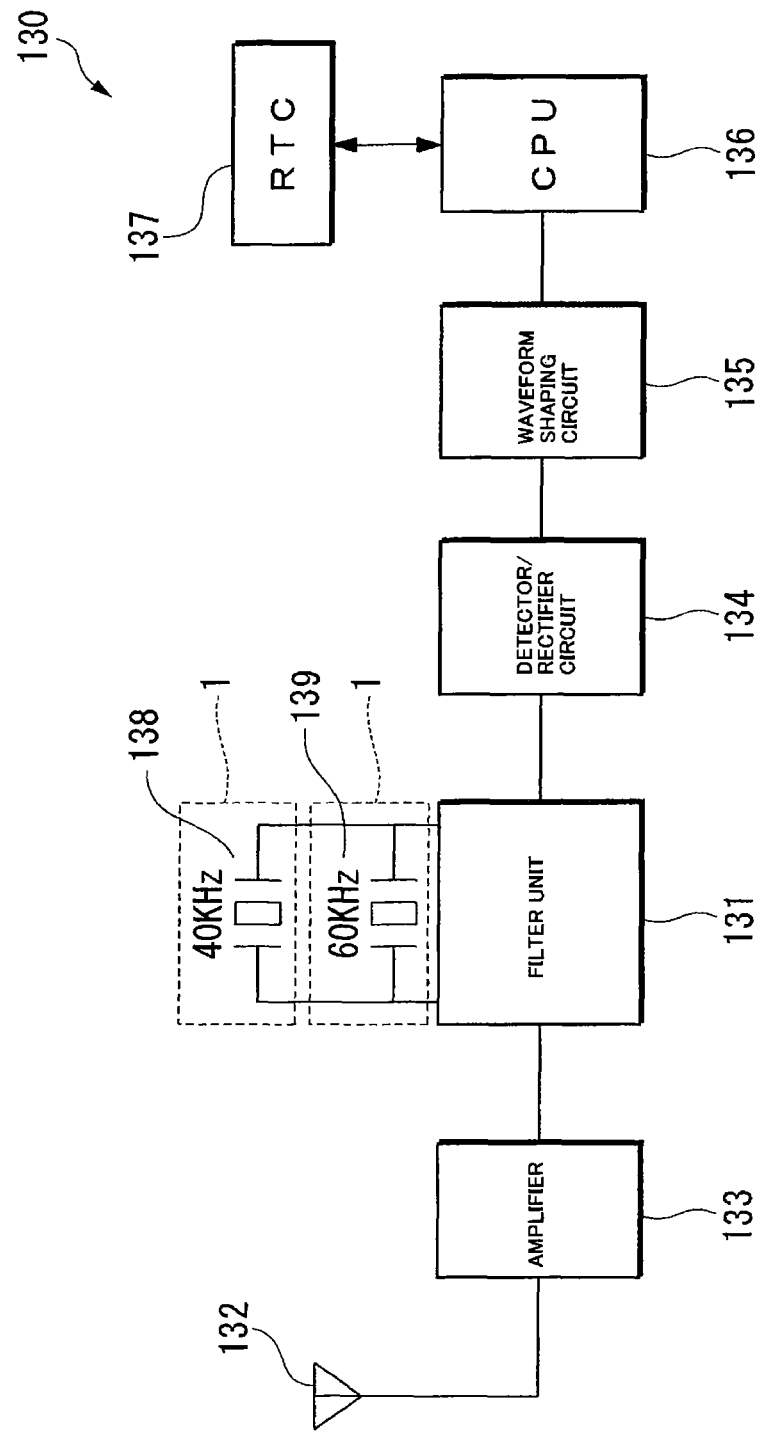
FIG. 16 is a configuration diagram showing an embodiment of a radio-controlled timepiece according to the invention.

As shown in FIG. 16, a radio-controlled timepiece 130 of the embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the ground of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1.

The piezoelectric vibrator 1 in the present embodiment includes crystal vibrator portions 138 and 139 having the same resonant frequencies of 40 KHz and 60 KHz as the transport frequency, respectively.

The signal of the filtered predetermined frequency is detected and demodulated by a detection and rectifier circuit 134. Next, the time code is taken out via a wave shaping circuit 135 and is counted by a CPU 136. In the CPU 136, information such as current year, accumulated date, day of the week, and time is read. The read information is reflected in an RTC 137 and the correct time information is displayed.

Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 capable of coping in foreign countries is built in a mobile phone, there is a need for the piezoelectric vibrator 1 having a different frequency from the case in Japan.

As mentioned above, according to the radio-controlled timepiece 130 of the present embodiment, since it includes the piezoelectric vibrator 1 of a high quality with an improved operational reliability, the radio-controlled timepiece itself can also improve the operational reliability to promote high quality. Additionally, it is possible to stably and accurately count the time over a long period of time.

In addition, the technical scope of the invention is not limited to the above embodiments but various modifications can be added within a scope without departing from the gist of the invention.

For example, in the above-mentioned embodiment, the getter material 34 is formed on the base substrate 2 (base substrate wafer 40), but if it is formed in the cavity C, for example, it may be formed on the lid substrate 3 (the lid substrate wafer 50) and may be formed on the surface of the piezoelectric vibrating reed 4.

Furthermore, in the above-mentioned embodiment, two getter materials 34 are formed so as to be oppositely arranged on both sides with the piezoelectric vibrating reed 4 pinched therebetween when seen from the plane, but, for example, it may be formed so as to adjoin only an outer part of the piezoelectric vibrating reed 4 when seen from the plane.

Furthermore, in the above-mentioned embodiment, the getter material 34 includes the under layer 34a and the finish layer 34b, but, for example, the getter material 34 may be formed only in the chromium under layer 34a. Furthermore, as the getter material 34, alloy consisting of chromium as a main ingredient may be used.

In addition, in the above-mentioned embodiment, the getter material forming process and the lead-out electrode forming process are performed concurrently, but they may be performed at a separate timing.

Furthermore, in the above-mentioned embodiments, as an example of the piezoelectric vibrating reed 4, the piezoelectric vibrating reed 4 with the grooves in which the groove portions 18 are formed in both surfaces of the vibration arm portions 10 and 11 is described, but it may be a type of piezoelectric vibrating reed without the groove portions 18. However, by forming the groove portions 18, when a predetermined voltage is applied to the pair of excitation electrodes 15, the electric field efficiency between the pair of excitation electrodes 15 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 18.

Furthermore, in the above-mentioned embodiment, the tuning fork type of piezoelectric vibrating reed 4 is explained as an example, but the invention is not limited to the tuning fork type. For example, it may be a thickness sliding vibrating reed.

Furthermore, in the above-mentioned embodiments, the base substrate 2 and the lid substrate 3 are anode-bonded via the bonding film 35, it is not limited to anode-bonding. However, anode-bonding is desirable in that both substrates 2 and 3 can be strongly bonded by the anode-bonding.

Moreover, in the above-mentioned embodiment, the piezoelectric vibrating reed 4 is bump-bonded, but the invention is not limited to bump-bonding. For example, the piezoelectric vibrating reed 4 may be bonded by the conductive adhesive. However, the piezoelectric vibrating reed 4 can float from the upper surface of the base substrate 2 by the bump-bonding, whereby it is possible to naturally secure the minimum vibration gap that is necessary for the vibration. Thus, the bump-bonding is desirable in this respect.

In addition, the constituents in the embodiment can be suitably substituted for known constituents without departing from the gist of the invention, and the above-mentioned modified examples may be suitably combined with each other.

Embodiment

Next, a result, in which the piezoelectric vibrator according to the invention and the piezoelectric vibrator of the related art are applied with a predetermined voltage and are vibrated, thereby measuring the series resonance resistance value R1 (hereinafter, simply referred to as R1 value) that is in a proportional relationship with the equivalent resistance value Re, is shown below. In addition, as described above, since the equivalent resistance value Re is in an inverse proportional relationship with the degree of vacuum in the cavity, the R1 value is also in the reverse proportional relationship with the degree of vacuum in the cavity, and the lower the R1 value is, the higher the degree of vacuum in the cavity is.

Herein, in performing the measurement, as the piezoelectric vibrator according to the invention, one in which the getter material is formed of only chromium and the thickness of the getter material is 600 A is used. Furthermore, as the piezoelectric vibrator of the related art, one in which the getter material is formed of only aluminum and the thickness of the getter material is 1100 A is used. That is, in the getter material of the piezoelectric vibrator according to the invention, a getter material having a thickness thinner than the getter material of the piezoelectric vibrator of the related art is used.

Moreover, in regard to the piezoelectric vibrator according to the invention and the piezoelectric vibrator of the related art, the condition is matched in the point other than the configuration of the getter material, and the respective piezoelectric vibrators are gettered by the same number, and the R1 values before and after the gettering are compared.

The comparison result is shown in the table of FIG. 17. The table of FIG. 17 is a table that shows R1 values (before the gettering (KΩ): A, after the gettering (KΩ): B) before and after the gettering, and a reduction amount (reduction amount (KΩ): A-B) of the R1 value before and after the gettering in regard to each of the piezoelectric vibrator (A1 (1100 A)) of the related art and the piezoelectric vibrator (Cr (600 A)) of the invention.

According to the result, in the piezoelectric vibrator according to the invention, it is confirmed that the reduction amount of the R1 value before and after the gettering is higher than the related art regardless of that the thickness of the getter material is thinner than that of the getter material of the piezoelectric vibrator of the related art. That is, by forming the getter material of chromium, it is confirmed that the gettering effect can be obtained more than the case of the related art of being formed of aluminum.

What is claimed is:

1. A method of manufacturing a piezoelectric vibrator, comprising:
    bonding a base substrate and a lid substrate with a cavity formed therebetween;
    forming an external electrode on a lower surface of the base substrate;
    forming an internal electrode on an upper surface of the base substrate so as to be accommodated in the cavity;
    forming a through electrode so as to pass through the base substrate and electrically connect the external electrode with the internal electrode;
    arranging a piezoelectric vibrating reed in the cavity in a state of being electrically connected to the internal electrode; and
    forming a getter material on the upper surface of the base substrate, wherein the getter material is formed of chromium or a metallic material consisting of chromium as a main ingredient;
    wherein forming the internal electrode comprises forming the internal electrode with the same material as that of the getter material and simultaneously with forming of the getter material.

2. A piezoelectric vibrator comprising:
    a base substrate and a lid substrate which are bonded to each other with a cavity formed therebetween;
    an external electrode that is formed on a lower surface of the base substrate;
    an internal electrode that is formed on an upper surface of the base substrate so as to be accommodated in the cavity;
    a through electrode which is formed so as to pass through the base substrate and electrically connect the external electrode with the internal electrode;
    a piezoelectric vibrating reed which is accommodated in the cavity in a state of being electrically connected to the internal electrode; and
    a getter material that is formed in the cavity, the getter material being formed of chromium or a metallic material consisting of chromium as a main ingredient and the getter material formed on the upper surface of the base substrate, wherein the internal electrode comprises the same material as that of the getter material and simultaneously formed with the getter material.

3. An oscillator in which the piezoelectric vibrator according to claim 2 is electrically connected to an integrated circuit as an oscillating element.

4. An electronic equipment in which the piezoelectric vibrator according to claim 2 is electrically connected to a measurement portion.

5. A radio-controlled timepiece in which the piezoelectric vibrator according to claim 2 is electrically connected to a filter portion.

* * * * *